United States Patent
Zhang

(10) Patent No.: US 11,217,125 B2
(45) Date of Patent: Jan. 4, 2022

(54) FLEXIBLE DISPLAY SCREENS AND DISPLAY DEVICES

(71) Applicant: YUNGU (GU'AN) TECHNOLOGY CO., LTD., Langfang (CN)

(72) Inventor: Wei Zhang, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 205 days.

(21) Appl. No.: 16/801,186

(22) Filed: Feb. 26, 2020

(65) Prior Publication Data
US 2020/0193876 A1 Jun. 18, 2020

Related U.S. Application Data

(63) Continuation of application No. PCT/CN2019/085065, filed on Apr. 29, 2019.

(30) Foreign Application Priority Data

Aug. 16, 2018 (CN) .......................... 201821325152.9

(51) Int. Cl.
*G09F 9/30* (2006.01)
*H01L 51/52* (2006.01)

(52) U.S. Cl.
CPC .......... *G09F 9/301* (2013.01); *H01L 51/5246* (2013.01); *H01L 51/5293* (2013.01); *H01L 2251/5338* (2013.01)

(58) Field of Classification Search
CPC .................................................... H01L 51/5246
See application file for complete search history.

(56) References Cited

FOREIGN PATENT DOCUMENTS

| | | |
|---|---|---|
| CN | 105867546 A | 8/2016 |
| CN | 205899447 U | 1/2017 |
| CN | 206116400 U | 4/2017 |
| CN | 206489536 U | 9/2017 |
| CN | 206505922 U | 9/2017 |
| CN | 107610595 A | 1/2018 |
| CN | 208622357 U | 3/2019 |
| WO | 2018076997 A1 | 5/2018 |

*Primary Examiner* — Vip Patel
(74) *Attorney, Agent, or Firm* — Kilpatrick Townsend & Stockton

(57) ABSTRACT

A display device and a flexible display screen thereof. The flexible display screen includes a display layer, a flexible cover plate layer, a rigid layer and a buffer layer. The flexible cover plate layer is disposed on a light emitting surface of the display layer. The rigid layer is light-transmitting and is disposed between the display layer and the flexible cover plate layer. The buffer layer is disposed between the display layer and the flexible cover plate layer. And a projection of the buffer layer on the flexible cover plate layer is located at an edge of the flexible cover plate layer.

18 Claims, 3 Drawing Sheets

FLEXIBLE DISPLAY SCREENS AND DISPLAY DEVICES

CROSS-REFERENCES TO RELATED APPLICATIONS

This application is a continuation application of international application PCT/CN2019/085065, filed on Apr. 29, 2019, which claims the priority benefit of Chinese patent application No. 201821325152.9, entitled "DISPLAY DEVICE AND FLEXIBLE DISPLAY SCREEN THEREOF", and filed on Aug. 16, 2018. The entireties of these applications are incorporated by reference herein for all purposes.

TECHNICAL FIELD

The present application relates to the field of display technology.

BACKGROUND

With the development of the flexible display technology, flexible display screens have become a development trend of display terminals. In order to realize the bendability of the flexible display screen, a flexible cover plate is usually adopted to protect the display elements. Unfortunately, conventional flexible display screens have various shortcomings, and novel techniques are desired.

SUMMARY

According to various embodiments, a flexible display screen and a display device using the flexible display screen are provided.

The flexible display screen includes a display layer, a flexible cover plate layer, a rigid layer and a buffer layer. The display layer has a light emitting surface. The flexible cover plate layer is disposed on the light emitting surface of the display layer. The rigid layer is light-transmitting and is disposed between the display layer and the flexible cover plate layer. The buffer layer is disposed between the display layer and the flexible cover plate layer. And a projection of the buffer layer on the flexible cover plate layer is located at an edge of the flexible cover plate layer.

In an embodiment, the rigid layer covers the display layer.

In an embodiment, the buffer layer is disposed between the rigid layer and the flexible cover plate layer.

In an embodiment, the flexible display screen further includes a first adhesive layer and a second adhesive layer. The first adhesive layer is disposed between the flexible cover plate layer and the rigid layer. The second adhesive layer is disposed between the rigid layer and the display layer. The first adhesive layer has a protrusion. The protrusion is abutted against the flexible cover plate layer. And the buffer layer is disposed outside and surrounding the protrusion.

In an embodiment, the buffer layer is disposed between the rigid layer and the display layer.

In an embodiment, the flexible display screen further includes a first adhesive layer and a second adhesive layer. The first adhesive layer is disposed between the flexible cover plate layer and the rigid layer. The second adhesive layer is disposed between the rigid layer and the display layer. The second adhesive layer has a protrusion. The protrusion is abutted against the rigid layer. And the buffer layer is disposed outside and surrounding the protrusion.

In an embodiment, the rigid layer has a thickness of 50 μm to 70 μm.

In an embodiment, the flexible display screen further includes a light blocking layer. The light blocking layer is attached to an edge of a surface, adjacent to the display layer, of the flexible cover plate layer. And the buffer layer is attached to the light blocking layer.

In an embodiment, the flexible display screen further includes a touch-control layer. And the touch-control layer is disposed between the display layer and the rigid layer.

In an embodiment, a material of the buffer layer is a non-light-transmitting material.

In an embodiment, a material of the buffer layer is an elastic material.

In an embodiment, the material of the buffer layer includes at least one of foam and silicone.

In an embodiment, the buffer layer has a honeycomb shaped structure.

In an embodiment, the buffer layer has an arched structure.

In an embodiment, the display layer includes a support film and a light emitting component layer. And the light emitting component layer is disposed on the support film.

In an embodiment, the display layer includes a shielding layer. The shielding layer is disposed on the light emitting component layer. And the shielding layer is configured to shield the light emitting component layer from being oxidized or polluted.

In an embodiment, the display layer further includes a polarizer. The polarizer is disposed on the shielding layer. The flexible display screen further includes a third adhesive layer. The third adhesive layer is disposed between the polarizer and the touch-control layer.

A display device including the aforementioned flexible display screen is further provided.

The details of one or more embodiments of this application are set forth in the accompanying drawings and description below. Other features, objects and advantages of the present application will become apparent from the description, the accompanying drawings, and the claims.

DETAILED DESCRIPTION OF THE INVENTION

During a drop ball test (a steel ball with a diameter of 20 mm is dropped from a height of 2 cm to 62.2 cm), it was found that the flexible display screen at the location struck by the ball may have undesirable display phenomenon such as a dark spot, a bright spot, or a colored spot. That is, the damage problems of display components such as a seal failure, a pixel cathode failure, and a pixel anode failure may occur on the flexible display screen at the location struck by the ball.

In order to make the above objects, features and advantages of the present application more apparent and better understood, embodiments of the application will be fully described hereinafter with reference to the accompanying drawings.

Figure 1:
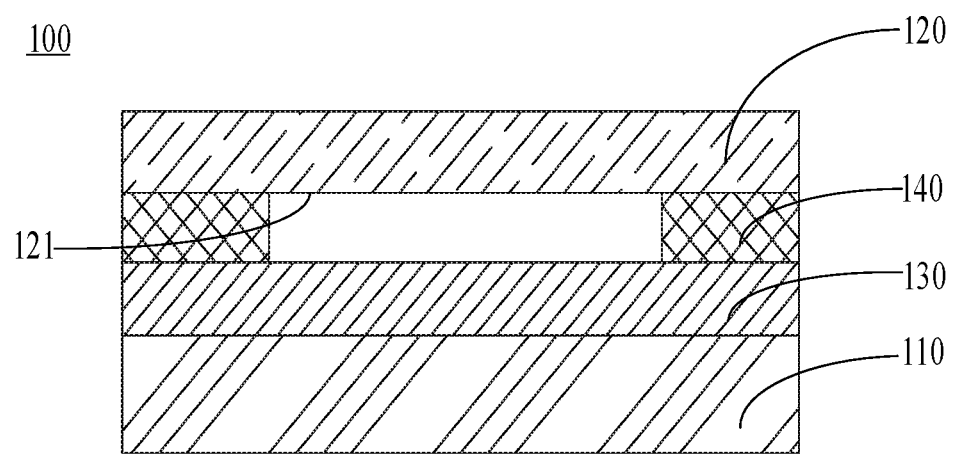
FIG. 1 is a cross-sectional view of an embodiment of a flexible display screen.

Referring to FIG. 1, a flexible display screen 100 according to an embodiment includes a display layer 110 and a flexible cover plate layer 120 stacked on the display layer 110. The display layer 110 is configured to display images. The display layer 110 can include different display components (not shown) such as a thin film transistor, a gate line, a data line, a capacitor, an anode, a cathode, an organic light emitting layer, a color filter film, and a touch-control layer. The flexible cover plate layer 120 is disposed on a light emitting surface of the display layer 110 to protect the display components of the display layer 110.

The flexible cover plate layer 120 is adopted to protect the display components of the display layer 110 to achieve a flexible characteristic of the flexible display screen 100. However, the impact resistance of the flexible cover plate layer 120 is relatively weak. In a drop ball test, a dark spot, a bright spot, or a colored spot may appear on the flexible display screen 100 at the location struck by the ball. This is because the stress tends to be concentrated rather than dissipated when the flexible cover plate layer 120 is struck by the heavy object, such that the impact force is directly transferred to the display layer 110 and damages the display components of the display layer 110.

In order to improve the impact resistance of the flexible display screen 100, the flexible display screen 100 further includes a light-transmitting rigid layer 130 and a buffer layer 140. Specifically, the rigid layer 130 and the buffer layer 140 are disposed between the flexible cover plate layer 120 and the display layer 110, and the rigid layer 130 and the buffer layer 140 are stacked with each other. Further, in order not to affect the light output of the flexible display screen 100, a projection of the buffer layer 140 on the flexible cover plate layer 120 is located at an edge of the flexible cover plate layer 120. The buffer layer 140 is disposed at a position of the flexible display screen 100 corresponding to a frame of a display device. An edge of a bottom surface of the flexible cover plate layer 120 is light-blocked to improve the display effect of the flexible display screen 100. The buffer layer 140 is disposed at the light-blocked position of the bottom surface of the flexible cover plate layer 120 to buffer the display layer 110 while not affecting the light output effect of the flexible display screen 100. The buffer layer 140 has a buffering structure and can absorb the impact force. The rigid layer 130 has a rigidity stronger than that of the flexible cover plate layer 120, such that the impact force received by the flexible cover plate layer 120 can be dissipated laterally along the body of the flexible display screen 100 to avoid stress concentration.

The above-described flexible display screen 110 includes a display layer 110, a rigid layer 130, a buffer layer 140, and a flexible cover plate layer 120 stacked with each other. The rigid layer 130 and the buffer layer 140 are disposed between the display layer 110 and the flexible cover plate layer 120. The rigid layer 130 can improve the rigidity of the flexible cover plate layer 120. When the flexible cover plate layer 120 is impacted by an external force, the rigid layer 130 can laterally transfer the external force along the body of the flexible display screen 110, such that the stress is dissipated thereby avoiding a damage to the display layer 110 caused by a vertically transferred external force. The buffer layer 140 can absorb a stress caused by the impact, which further improves the impact resistance of the flexible display screen 100. The projection of the buffer layer 140 on the flexible cover plate layer 120 is located at the edge of the flexible cover plate layer 120, such that the buffer layer 140 buffers the display layer 110 while not interfering the light output of the display layer 110.

Further, the up-and-down relative position between the rigid layer 130 and the buffer layer 140 is not limited. Specifically, referring to FIG. 1, in an embodiment, the buffer layer 140 can be disposed between the flexible cover plate layer 120 and the rigid layer 130. The buffer layer 140 is disposed on the surface of the rigid layer 130 adjacent to the flexible cover plate layer 120. Therefore, when the flexible cover plate layer 120 receives an impact force, the impact stress is absorbed and weakened by the buffer layer 140 and then passed to and dissipated by the rigid layer 130, thereby reducing the impact stress on the display layer 110.

Figure 2:
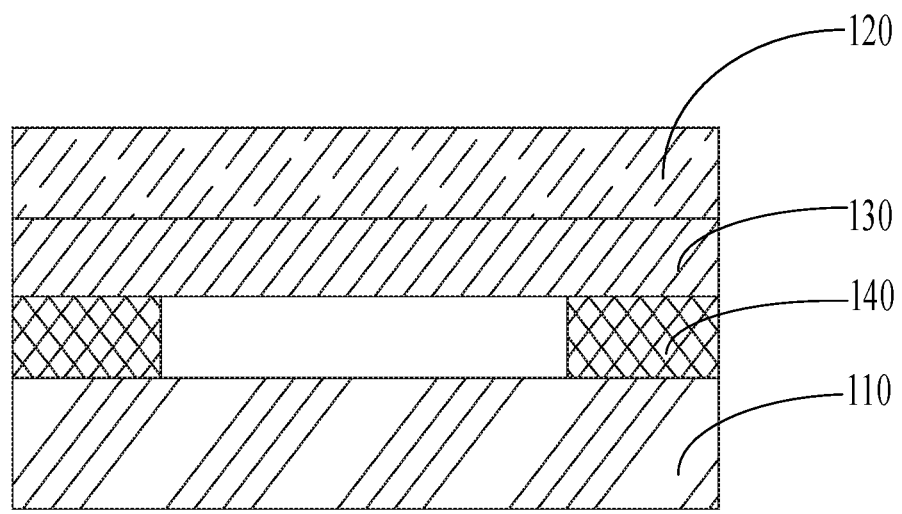
FIG. 2 is a cross-sectional view of another embodiment of the flexible display screen.

Referring to FIG. 2, in another embodiment, the buffer layer 140 can also be disposed between the display layer 110 and the rigid layer 130. That is, the buffer layer 140 is disposed on a surface of the rigid layer 130 adjacent to the display layer 110. When the flexible cover plate layer 110 is impacted by a heavy object or an external force, the impact stress can be laterally transferred through the buffer layer 140 thereby uniformly dissipated across the entire surface of the buffer layer 140 to avoid a stress concentration. Then the impact stress can be absorbed and weakened through the buffer layer 140. Accordingly, the stress on the display layer 110 caused by the impact can be greatly reduced, and the impact resistance of the flexible display screen 100 can be improved.

Specifically, in an embodiment, the display layer 110 is covered by the rigid layer 130, such that the rigid layer 130 can protect the entire display layer 110. No matter where the surface of the display layer 110 is impacted, the rigid layer 130 can dissipate the impact stress to the entire surface of the display layer 110 in advance, thereby avoiding the damage to the display components at that location caused by the stress concentration.

In an embodiment, the rigid layer 110 is made of a rigid and light-transmitting material, such as ultra-thin glass. Further, in order to ensure the bendability and the hand feeling of the flexible display screen 100, the thickness of the rigid layer 130 needs to be as thin as possible. However, considering the difficulty of the manufacturing process and the cost, the rigid layer 130 should not be too thin. In an embodiment, the thickness of the rigid layer 130 is 50 µm to 70 µm. For ultra-thin glass, the thickness of 50 µm is a relatively thin thickness that can be achieved by current technique in the industry. Meanwhile, to ensure the bendability and the overall thickness of the flexible display screen 100, the thickness of the rigid layer 130 should be smaller than 70 µm.

Specifically, in an embodiment, the buffer layer 130 is an elastic buffer layer, such as made of foam or silicone. Alternatively, the buffer layer 130 has a buffer structure. For example, the buffer layer 130 has a honeycomb shaped structure or a plurality of arched structures. When being impacted by an external force, the honeycomb shaped structure or the arched structures can absorb and dissipate the impact stress, therefore playing a buffer effect.

Figure 3:
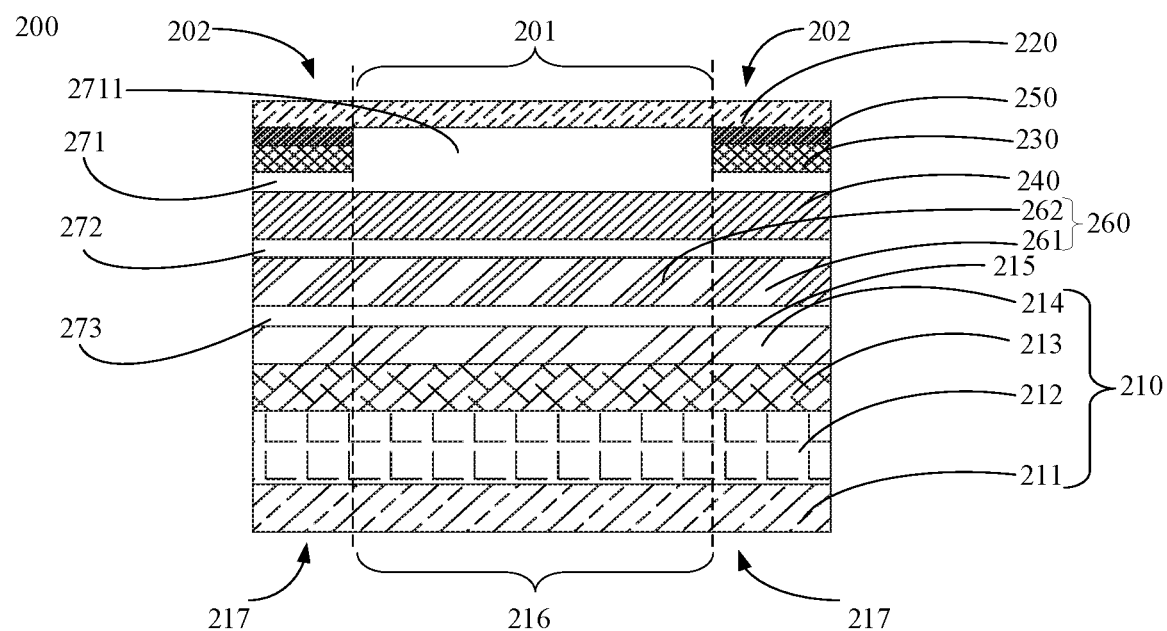
FIG. 3 is a cross-sectional view of yet another embodiment of the flexible display screen.

Referring to FIG. 3, in another embodiment, the flexible display screen 200 includes a display layer 210, a rigid layer 240, a buffer layer 230, and a flexible cover plate layer 220 stacked with each other. The display layer 210 has a light emitting surface 215 configured to display images. The flexible cover plate layer 220 is disposed on a side of the display layer 210 having the light emitting surface 215. The rigid layer 240 and the buffer layer 230 are disposed between the display layer 210 and the rigid layer 240.

In an embodiment, the flexible cover plate 220 has a light-transmitting region 201 that is capable of having light transmitted therethrough and a light blocking region 202 that is a non-light-transmitting region. The rigid layer 240 is made of a light-transmitting rigid material, such as ultra-thin glass. The rigid layer 240 covers the light emitting surface 215 of the display layer 210. In an embodiment, the buffer layer 230 is made of a non-light-transmitting material, such as a foam material. The buffer layer 230 is disposed on an edge of a surface of the flexible cover plate 220 adjacent to the display layer 210, such that the edge of the flexible cover plate 220 forms the light blocking region 202. As a result, the buffer layer 230 buffers the flexible cover plate layer 220 while plays a light blocking effect, blocking the non-active region of the display layer 210 corresponding to the frame, thereby beautifying the flexible display screen 200 and further improving the display effect of the flexible display screen 200. It should be noted that, the buffer layer 230 can also be made of a light-transmitting buffer colloid, such as silica gel. In this case, the light blocking region 202 of the flexible cover plate 220 can be achieved by other ways.

Specifically, in an embodiment, the flexible display screen 200 further includes a light blocking layer 250. The light blocking layer 250 is attached to an edge of a surface, adjacent to the display layer 210, of the flexible cover plate layer 220, such that the edge of the flexible display screen 200 blocks the light, forming the light blocking region 202, so as to improve the display effect. The buffer layer 230 can be disposed on a surface of the light blocking layer 250. The buffer layer 230 disposed on the surface of the light blocking layer 250 can be made of a light-transmitting buffer material to buffer the display layer 210. The buffer layer 230 disposed on the surface of the light blocking layer 250 can also be made of a non-light-transmitting buffer material. The non-light-transmitting buffer layer 230 buffers the display layer 210, while blocking light together with the light blocking layer 250 for the flexible display screen 200. A material of the light blocking layer 250 can be ink.

In an embodiment, the flexible display screen 200 further includes a touch-control layer 260. The touch-control layer 260 is disposed between the display layer 210 and the rigid layer 240. The touch-control layer 260 includes a touch-control circuit (not shown) configured to sense a user's touch operation on the flexible display screen 200. In an embodiment, the touch-control layer 260 is divided into a visible region 262 and a non-visible region 261 located outside and surrounding the visible region 262. The touch circuit is disposed in the visible region 262. The visible region 262 corresponds to the light-transmitting region 201 of the flexible display screen 200, and the non-visible region 261 corresponds to the light blocking region 202 of the flexible display screen 200. Therefore, the non-visible region 261 can be hidden behind the light blocking region 202, which reduces a color difference on the flexible display screen 200 caused by a light leakage at the edge of the visible region 262, and beautifies the flexible display screen 200.

Specifically, referring to FIG. 3, in an embodiment, the flexible display screen 200 further includes a first adhesive layer 271 and a second adhesive layer 272. The first adhesive layer 271 is disposed between the flexible cover plate layer 120 and the rigid layer 240. The second adhesive layer 272 is disposed between the rigid layer 240 and the display layer 210. The first adhesive layer 271 and the second adhesive layer 272 serve as adhesives, and are configured to adhere the flexible cover plate layer 220 and the rigid layer 240, and to adhere the rigid layer 240 and the display layer 210. In an embodiment, both the first adhesive layer 271 and the second adhesive layer 272 are optical adhesives. The optical adhesives have characteristics such as, are colorless and transparent, have a light transmittance larger than or equal to 90%, have a good bonding strength, can be cured at room temperature or medium temperature, and have a small curing shrinkage.

Optionally, in an embodiment, the first adhesive layer 271 has a protrusion 2711 protruding outward from a central portion of the first adhesive layer 271. The protrusion 2711 is abutted against the flexible cover plate layer 220. The buffer layer 230 is disposed outside and surrounding the protrusion 2711. The protrusion 2711 is configured to support the flexible cover plate layer 220 to prevent sinking of a central portion of the flexible cover plate layer 220. In addition, the buffer layer 230 is disposed outside and surrounding the protrusion 2711, such that the protrusion 2711 adheres and fastens the buffer layer 230.

Optionally, in another embodiment, the second adhesive layer 272 has a protrusion protruding outward from a central portion of the second adhesive layer 271. The protrusion is abutted against the rigid layer 240. The buffer layer 230 is disposed outside and surrounding the protrusion of the second adhesive layer 272.

In an embodiment, the display layer 210 has an active region 216 configured to display images and a non-active region 217 located outside and surrounding the active region 216. Components configured for displaying images, such as light emitting components (not shown), pixel arrays (not shown), and the like are distributed in the active region 216. An integrated circuit (not shown) configured to transmit electrical signals and driving the light emitting components to emit lights is arranged in the non-active region 217. The active region 216 corresponds to the light-transmitting region 201, such that the image displayed by the active region 216 can be visible through the light-transmitting region 201 by the user. The non-active region 217 corresponds to the light blocking region 202, such that the non-active region 217 can be hidden behind the light blocking region 202.

In an embodiment, the display layer 210 includes a support film 211 configured to support the flexible display screen 200 and a light emitting component layer 212 disposed on the support film 211. The light emitting component layer 212 includes various structures (not shown) such as a thin film transistor, a gate line, a data line, a capacitor, an anode, a cathode, an organic light emitting layer, and a color filter film. The light emitting components are disposed in the active region 216 of the display layer 210. The light emitting component layer 212 can be an OLED layer. The display layer 210 can include a shielding layer 213 disposed on the light emitting component layer 212, and the shielding layer 213 is configured to shield the light emitting component layer 212 from being oxidized or polluted by impurities such as air. The display layer 210 can further include a polarizer 214 disposed on the shielding layer 213, and the polarizer 214 is configured to increase the light transmittance of the display layer 210 and reduce external light reflection. In an embodiment, the flexible display screen 200 further includes a third adhesive layer 273 disposed between the polarizer 214 and the touch-control layer 260.

In an embodiment, a display device is further provided. The display device includes the flexible display screen of any of the above-described embodiments. The display device can further include a frame for supporting the flexible display screen and a protective cover plate (not shown) for protecting the flexible display screen. The frame surrounds the edge of the flexible display screen. Further, the frame can be flexible, but the rigidity of the frame is higher than that of the flexible display screen. The protective cover plate is attached on the display surface of the flexible display screen. The display device can be such as a mobile phone, a tablet computer, or the like.

The display device is equipped with the above-described flexible display screen 100. The rigid layer 130 and the buffer layer 140 are disposed between the display layer 110 and the flexible cover plate layer 120 in the flexible display screen 100. The rigid layer 130 can increase the hardness of the flexible cover plate layer 120. When the flexible cover plate layer 120 is impacted by an external force, the rigid layer 130 can laterally transfer the external force along the body of the flexible display screen 100 to dissipate the stress, thereby avoiding the damage to the display layer 110 due to the vertically transferring the external force. The buffer layer 140 can absorb the impact stress and buffer the display layer 110. In addition, the projection of the buffer layer 140 on the flexible cover plate layer 120 is located at the edge of the surface of the flexible cover plate layer 120, and the surface of the flexible cover plate layer 120 is adjacent to the display layer 110, such that the buffer layer 140 buffers the display layer 110 while not interfering the light output of the display layer 110. The rigid layer 130 and the buffer layer 140 improve the impact resistance of the flexible display screen 100, thereby increasing the service life of the display device.

The technical features of the above-described embodiments can be combined arbitrarily. To simplify the description, not all possible combinations of the technical features in the above embodiments are described. However, all of the combinations of these technical features should be considered as within the scope of this application, as long as such combinations do not contradict with each other.

For a person of ordinary skilled in the art, several variations and improvements can be made without departing from the concept of this application, and these are all within the protection scope of this application. Therefore, the protection scope of this application shall be decided by the appended claims.

The invention claimed is:

1. A flexible display screen, comprising:
   a display layer having a light emitting surface;
   a flexible cover plate layer disposed on the light emitting surface; and
   a buffer layer and a rigid layer positioned between the display layer and the flexible cover plate layer, a projection of the buffer layer on the flexible cover plate layer being located at an edge of the flexible cover plate layer.

2. The flexible display screen of claim 1, wherein the rigid layer covers the display layer.

3. The flexible display screen of claim 2, wherein the buffer layer is positioned between the rigid layer and the flexible cover plate layer.

4. The flexible display screen of claim 3, further comprising a first adhesive layer and a second adhesive layer;
   wherein the first adhesive layer is positioned between the flexible cover plate layer and the rigid layer, the second adhesive layer is positioned between the rigid layer and the display layer, the first adhesive layer comprises a protrusion, the protrusion is abutted against the flexible cover plate layer, and the buffer layer is positioned outside and surrounding the protrusion.

5. The flexible display screen of claim 2, wherein the buffer layer is positioned between the rigid layer and the display layer.

6. The flexible display screen of claim 5, further comprising a first adhesive layer and a second adhesive layer;
   wherein the first adhesive layer is positioned between the flexible cover plate layer and the rigid layer, the second adhesive layer is positioned between the rigid layer and the display layer, the second adhesive layer comprises a protrusion, the protrusion is abutted against the rigid layer, and the buffer layer is positioned outside and surrounding the protrusion.

7. The flexible display screen of claim 1, wherein the rigid layer has a thickness range of 50 μm to 70 μm.

8. The flexible display screen of claim 1, further comprising a light blocking layer;
   wherein the light blocking layer is positioned between the flexible cover plate layer and the buffer layer.

9. The flexible display screen of claim 1, further comprising a touch-control layer;
   wherein the touch-control layer is positioned between the display layer and the rigid layer.

10. The flexible display screen of claim 1, wherein a material of the buffer layer is opaque to light.

11. The flexible display screen of claim 1, wherein the buffer layer comprises an elastic material.

12. The flexible display screen of claim 11, wherein the buffer layer comprises at least one of foam and silicone.

13. The flexible display screen of claim 1, wherein the buffer layer comprises a honeycomb-shaped structure.

14. The flexible display screen of claim 1, wherein the buffer layer comprises an arched structure.

15. The flexible display screen of claim 1, wherein the display layer comprises a support film and a light emitting component layer disposed on the support film.

16. The flexible display screen of claim 15, wherein the display layer comprises a shielding layer positioned on the light emitting component layer, and the shielding layer is configured to shield the light emitting component layer from being oxidized or polluted.

17. The flexible display screen of claim 16, further comprising a third adhesive layer and a touch-control layer, wherein the touch-control layer is positioned between the display layer and the rigid layer, the display layer further comprises a polarizer positioned on the shielding layer, and the third adhesive layer is positioned between the polarizer and the touch-control layer.

18. A display device, comprising the flexible display screen of claim 1.

* * * * *